United States Patent
Yamazaki et al.

(10) Patent No.: US 10,927,278 B2
(45) Date of Patent: Feb. 23, 2021

(54) CURABLE ORGANOPOLYSILOXANE COMPOSITION AND SEMICONDUCTOR DEVICE

(71) Applicant: Dow Corning Toray Co., Ltd., Tokyo (JP)

(72) Inventors: Ryosuke Yamazaki, Chiba (JP); Kazuhiro Nishijima, Chiba (JP); Tomohiro Iimura, Chiba (JP); Manabu Sutoh, Chiba (JP)

(73) Assignee: DUPONT TORAY SPECIALTY MATERIALS KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/488,291

(22) PCT Filed: Feb. 2, 2018

(86) PCT No.: PCT/JP2018/003534
§ 371 (c)(1),
(2) Date: Aug. 23, 2019

(87) PCT Pub. No.: WO2018/155131
PCT Pub. Date: Aug. 30, 2018

(65) Prior Publication Data
US 2019/0375969 A1    Dec. 12, 2019

(30) Foreign Application Priority Data

Feb. 27, 2017 (JP) .............................. JP2017-035450

(51) Int. Cl.
C09J 183/04 (2006.01)
H01L 33/48 (2010.01)
H01L 23/00 (2006.01)

(52) U.S. Cl.
CPC ............ C09J 183/04 (2013.01); H01L 33/48 (2013.01); H01L 24/29 (2013.01); H01L 24/73 (2013.01); H01L 2224/2919 (2013.01); H01L 2224/32245 (2013.01); H01L 2224/73265 (2013.01)

(58) Field of Classification Search
CPC .......... C07F 7/045; C07F 7/18; C07F 7/1804; C08L 83/04; C08G 77/12; C08G 77/20; C09J 183/04; H01L 33/48
See application file for complete search history.

(56) References Cited

U.S. PATENT DOCUMENTS

| | | | |
|---|---|---|---|
| 5,446,087 A * | 8/1995 | Chizat ................... | C08L 83/04 524/588 |
| 8,772,812 B2 | 7/2014 | Yoshitake et al. | |
| 8,809,414 B2 | 8/2014 | Ide et al. | |
| 9,012,586 B2 | 4/2015 | Yoshitake et al. | |
| 9,177,883 B2 | 11/2015 | Ko et al. | |
| 9,312,196 B2 | 4/2016 | Iimura et al. | |
| 9,660,157 B2 | 5/2017 | Yamazaki et al. | |
| 9,688,822 B2 | 6/2017 | Suto et al. | |
| 10,077,338 B2 | 9/2018 | Mizunashi et al. | |
| 10,493,723 B2 | 12/2019 | Bradford et al. | |
| 2006/0081864 A1 | 4/2006 | Nakazawa | |
| 2011/0237702 A1 | 9/2011 | Ide et al. | |
| 2014/0187733 A1 | 7/2014 | Okawa et al. | |
| 2014/0191161 A1 | 7/2014 | Amako et al. | |
| 2015/0252221 A1 | 9/2015 | Iimura et al. | |
| 2015/0329681 A1 | 11/2015 | Suto et al. | |
| 2016/0185912 A1 | 6/2016 | Mizunashi et al. | |
| 2016/0280861 A1 | 9/2016 | Ogawa | |

FOREIGN PATENT DOCUMENTS

| | | |
|---|---|---|
| CN | 1798810 A | 7/2006 |
| CN | 102171268 A | 8/2011 |
| CN | 103781824 A | 5/2014 |
| CN | 103781852 A | 5/2014 |
| CN | 104066794 A | 9/2014 |

(Continued)

OTHER PUBLICATIONS

International Search Report for Application No. PCT/JP2018/003534 dated May 15, 2018, 3 pages.
English language abstract for CN 1798810 extracted from espacenet.com database on Sep. 9, 2019, 1 page.
English language abstract for CN 102171268 extracted from espacenet.com database on Sep. 9, 2019, 1 page.
English language abstract for CN 103781824 extracted from espacenet.com database on Sep. 9, 2019, 1 page.
English language abstract for CN 103781852 extracted from espacenet.com database on Sep. 9, 2019, 2 pages.
English language abstract for CN 104066794 extracted from espacenet.com database on Sep. 9, 2019, 1 page.
English language abstract for CN 104812807 extracted from espacenet.com database on Sep. 9, 2019, 1 page.

(Continued)

*Primary Examiner* — Kuo Liang Peng
(74) *Attorney, Agent, or Firm* — Howard & Howard Attorneys PLLC

(57) ABSTRACT

The present invention pertains to a curable organopolysiloxane composition comprising at least (A) an organopolysiloxane having at least two alkenyl groups per module, (B) an organopolysiloxane resin represented by average unit formula: $(R^1_3SiO_{1/2})_a(R^1_2SiO_{2/2})_b(R^2SiO_{3/2})_c(SiO_{4/2})_d$. In the formula, $R^1$'s are the same or different from each other, and represent a hydrogen atom or a monovalent hydrocarbon group not having an aliphatic unsaturated carbon bond but at least two of the $R^1$'s per molecule represent hydrogen atoms, $R^2$ represents a monovalent hydrocarbon group not having an aliphatic unsaturated bond, and a, b, and c are numbers satisfying $0<a<1$, $0<b<1$, and $0\leq c\leq 0.2$, and $0<d<1$, respectively, but are also numbers satisfying $0.6\leq a/d$ 1.5, $1.5\leq b/d\leq 3$, and $a+b+c+d=1$, and (C) a catalyst for hydrosilylation reaction. This composition has excellent adhesiveness to a semiconductor element, and can form a cured product in which only a small number of bubbles are produced.

8 Claims, 1 Drawing Sheet

(56) References Cited

FOREIGN PATENT DOCUMENTS

| | | | |
|---|---|---|---|
| CN | 104812807 | A | 7/2015 |
| CN | 104812841 | A | 7/2015 |
| CN | 105542475 | A | 5/2016 |
| CN | 105733269 | A | 7/2016 |
| EP | 1651724 | A2 | 5/2006 |
| EP | 2343326 | A1 | 7/2011 |
| EP | 2730620 | A1 | 5/2014 |
| EP | 2733160 | A1 | 5/2014 |
| EP | 2784127 | A1 | 10/2014 |
| EP | 2912128 | A1 | 9/2015 |
| EP | 2914664 | A1 | 9/2015 |
| EP | 2920228 | A2 | 9/2015 |
| EP | 3037457 | A1 | 6/2016 |
| EP | 3103843 | A1 | 12/2016 |
| JP | 2004359756 | A | 12/2004 |
| JP | 2010285518 | A | 12/2010 |
| JP | 2011208074 | A | 10/2011 |
| JP | 2012012433 | A | 1/2012 |
| JP | 2012012434 | A | 1/2012 |
| JP | 2014084417 | A | 5/2014 |
| JP | 2014088513 | A | 5/2014 |
| JP | 2014098080 | A | 5/2014 |
| JP | 2015503005 | A | 1/2015 |
| JP | 2016084419 | A | 5/2016 |
| JP | 2016121290 | A | 7/2016 |
| JP | 2016155967 | A | 9/2016 |
| JP | 2017088853 | A | 5/2017 |
| JP | 2018111783 | A | 7/2018 |
| KR | 20060016107 | A | 2/2006 |
| KR | 20110074516 | A | 6/2011 |
| KR | 20130058639 | A | 6/2013 |
| KR | 20140048240 | A | 4/2014 |
| KR | 20140072018 | A | 6/2014 |
| KR | 20150081292 | A | 7/2015 |
| KR | 20160078897 | A | 7/2016 |
| TW | 201307440 | A | 2/2013 |
| TW | 201420685 | A | 6/2014 |
| TW | 201420686 | A | 6/2014 |
| TW | 201430014 | A | 8/2014 |
| WO | 2004107458 | A2 | 12/2004 |
| WO | 2010038767 | A1 | 4/2010 |
| WO | 2013005858 | A1 | 1/2013 |
| WO | 2013005859 | A1 | 1/2013 |
| WO | 2014065432 | A1 | 5/2014 |
| WO | 2014069610 | A1 | 5/2014 |
| WO | 2014077412 | A2 | 5/2014 |
| WO | 2014105963 | A2 | 7/2014 |

OTHER PUBLICATIONS

English language abstract for CN 104812841 extracted from espacenet.com database on Sep. 9, 2019, 2 pages.
English language abstract and machine-assisted English translation for CN 105542475 extracted from espacenet.com database on Sep. 9, 2019, 10 pages.
English language abstract for CN 105733269 extracted from espacenet.com database on Sep. 9, 2019, 2 pages.
English language abstract for JP 2004-359756 extracted from espacenet.com database on Sep. 9, 2019, 2 pages.
English language abstract and machine-assisted English translation for JP 2010-285518 extracted from espacenet.com database on Sep. 9, 2019, 26 pages.
English language abstract and machine-assisted English translation for JP 2011-208074 extracted from espacenet.com database on Sep. 9, 2019, 27 pages.
English language abstract for JP 2012-012433 extracted from espacenet.com database on Sep. 9, 2019, 2 pages.
English language abstract for JP 2012-012434 extracted from espacenet.com database on Sep. 9, 2019, 2 pages.
English language abstract for JP 2014-084417 extracted from espacenet.com database on Sep. 9, 2019, 2 pages.
English language abstract for JP 2014-088513 extracted from espacenet.com database on Sep. 9, 2019, 2 pages.
English language abstract for JP 2014-098080 extracted from espacenet.com database on Sep. 9, 2019, 1 page.
English language abstract for JP 2015-503005 extracted from espacenet.com database on Sep. 9, 2019, 1 page.
English language abstract and machine-assisted English translation for JP 2016-084419 extracted from espacenet.com database on Sep. 9, 2019, 10 pages.
English language abstract for JP 2016-121290 extracted from espacenet.com database on Sep. 9, 2019, 1 page.
English language abstract for JP 2016-155967 extracted from espacenet.com database on Sep. 9, 2019, 1 page.
English language abstract for KR 2006-0016107 extracted from espacenet.com database on Sep. 9, 2019, 1 page.
English language abstract for KR 2011-0074516 extracted from espacenet.com database on Sep. 9, 2019, 1 page.
English language abstract for KR 2013-0058639 extracted from espacenet.com database on Sep. 9, 2019, 2 pages.
English language abstract for KR 2014-0048240 extracted from espacenet.com database on Sep. 9, 2019, 1 page.
English language abstract for KR 2014-0072018 extracted from espacenet.com database on Sep. 9, 2019, 2 pages.
English language abstract for KR 2015-0081292 extracted from espacenet.com database on Sep. 9, 2019, 2 pages.
English language abstract for KR 2016-0078897 extracted from espacenet.com database on Sep. 9, 2019, 1 page.
English language abstract for TW 201307440 extracted from espacenet.com database on Sep. 9, 2019, 1 page.
English language abstract for TW 201420685 extracted from espacenet.com database on Sep. 9, 2019, 2 pages.
English language abstract for TW 201420686 extracted from espacenet.com database on Sep. 9, 2019, 2 pages.
English language abstract for TW 201430014 extracted from espacenet.com database on Sep. 9, 2019, 1 page.
English language abstract for WO 2010/038767 extracted from espacenet.com database on Sep. 9, 2019, 1 page.
English language abstract for WO 2013/005858 extracted from espacenet.com database on Sep. 9, 2019, 2 pages.
English language abstract for WO 2013/005859 extracted from espacenet.com database on Sep. 9, 2019, 2 pages.
English language abstract for JP 2017-088853 extracted from espacenet.com database on May 11, 2020, 2 pages.
English language abstract and machine-assisted English translation for JP 2018-111783 extracted from espacenet.com database on May 11, 2020, 23 pages.

* cited by examiner

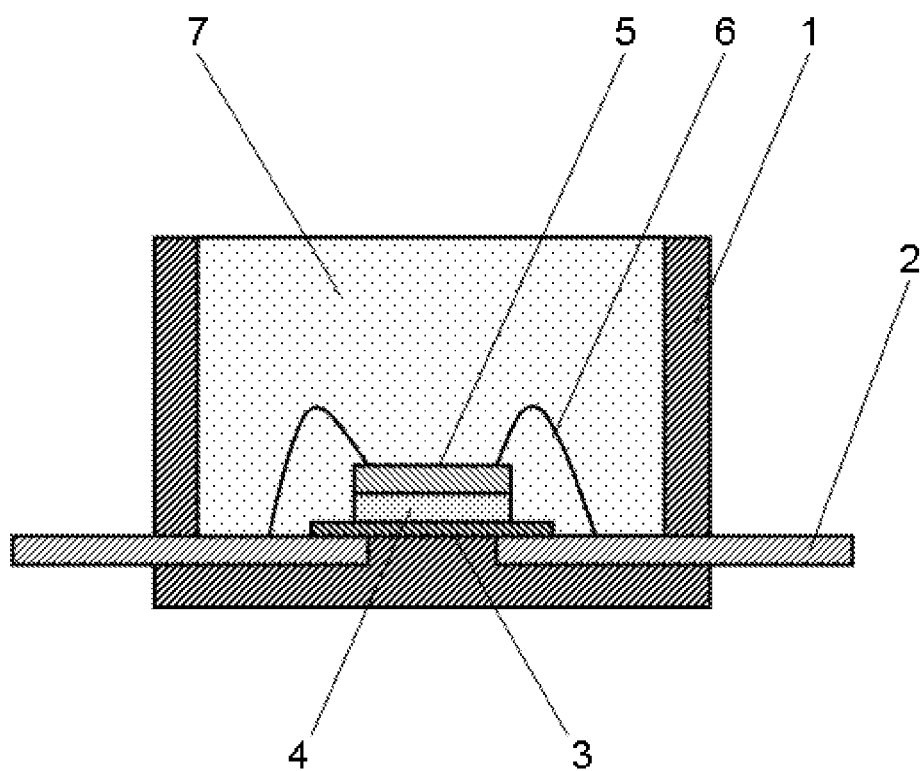

CURABLE ORGANOPOLYSILOXANE COMPOSITION AND SEMICONDUCTOR DEVICE

CROSS-REFERENCE TO RELATED APPLICATIONS

The present application is the National Stage of International Patent Application No. PCT/JP2018/003534, filed on Feb. 2, 2018, which claims priority to and all the benefits of Japanese Patent Application No. 2017-035450, filed on Feb. 27, 2017, which are hereby expressly incorporated herein by reference in their entirety.

TECHNICAL FIELD

The present invention relates to a curable organopolysiloxane composition and a semiconductor device comprised by adhering a semiconductor element with a cured material of the composition.

BACKGROUND ART

Curable organopolysiloxane compositions have been used to adhere the semiconductor element in a semiconductor device having a semiconductor element such as a photocoupler, a light-emitting diode, or a solid-state image sensor. As examples of such a curable organopolysiloxane composition, Patent Literature 1 and 2, for example, have proposed a curable organopolysiloxane composition comprising a substantially linear or cyclic alkenyl-containing organopolysiloxane, a branched alkenyl-containing organopolysiloxane, a linear organopolysiloxane having a silicon-bonded hydrogen in a molecular chain, and a branched organopolysiloxane having a silicon-bonded hydrogen—specifically, an organopolysiloxane resin represented by an average unit formula: $[H(CH_3)_2SiO_{1/2}]_{0.67}(SiO_{4/2})_{0.33}$ and an organopolysiloxane resin represented by an average unit formula: $[H(CH_3)_2SiO_{1/2}]_{0.50}[(CH_3)_3SiO_{1/2}]_{0.17}(SiO_{4/2})_{0.33}$—and a hydrosilylation catalyst, and Patent Literature 3 has disclosed a curable organopolysiloxane composition comprising a linear organopolysiloxane having at least two alkenyl per molecule, a branched organopolysiloxane having at least two alkenyl per molecule, and a branched organopolysiloxane having at least two silicon-bonded hydrogen per molecule—specifically, an organopolysiloxane resin represented by an average unit formula: $[H(CH_3)_2SiO_{1/2}]_{0.44}(SiO_{4/2})_{0.56}$, an organopolysiloxane resin represented by an average unit formula: $[H(CH_3)_2SiO_{1/2}]_{0.25}[(CH_3)_3SiO_{1/2}]_{0.25}(SiO_{4/2})_{0.50}$, and an organopolysiloxane resin represented by an average unit formula: $[(CH_3)_2SiO_{1/2}]_{0.20}[H(CH_3)_3SiO_{2/2}]_{0.40}(SiO_{4/2})_{0.40}$—and a hydrosilylation catalyst.

Although the organopolysiloxane having a silicon-bonded hydrogen in these curable organopolysiloxane compositions is contained to adjust the mechanical strength and/or hardness of the resulting cured material, such a curable organopolysiloxane composition has the problem of insufficient adhesion to a semiconductor element or reduced adhesive strength due to bubbling occurring in the cured material.

PRIOR ART LITERATURE

Patent Literature

PATENT LITERATURE 1: Japanese Unexamined Patent Publication No. 2012-012433

PATENT LITERATURE 2: Japanese Unexamined Patent Publication No. 2012-012434

PATENT LITERATURE 3: Japanese Unexamined Patent Publication No. 2016-155967

SUMMARY OF THE INVENTION

Problems that the Invention is to Solve

An objective of the present invention is to provide a curable organopolysiloxane composition having excellent adhesion to a semiconductor element, and forming a cured material with little bubbling. Another objective of the present invention is to provide a semiconductor device having excellent reliability.

Means of Solving the Problems

The curable organopolysiloxane composition of the present invention comprises at least
(A) an organopolysiloxane having at least two alkenyl per molecule;
(B) an organopolysiloxane resin represented by the average unit formula:

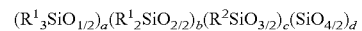
$(R^1{}_3SiO_{1/2})_a(R^1{}_2SiO_{2/2})_b(R^2SiO_{3/2})_c(SiO_{4/2})_d$ (where $R_1$ is the same or different hydrogen or a monovalent hydrocarbon not having an aliphatic unsaturated carbon bond, but at least two $R^1$ per molecule are hydrogen, $R^2$ is a monovalent hydrocarbon not having an aliphatic unsaturated bond, and a, b, and c are numbers satisfying $0<a<1$, $0<b<1$, $0\leq c<0.2$, and $0<d<1$, but $0.6\leq a/d\leq 1.5$, $1.5\leq b/d\leq 3$, and $a+b+c+d=1$)
(at a quantity so that the molar ratio of silicon-bonded hydrogen in the component (B) to alkenyl in the component (A) is 0.5 to 5);
and
(C) a hydrosilylation catalyst (at a sufficient quantity to cure the composition).

The composition preferably also comprises (D) 1 to 20 parts by mass of fumed silica having a BET specific surface area of 20 to 200 m²/g, to 100 total parts by mass of the components (A) to (C).

The composition preferably also comprising (E) 0.001 to 5 parts by mass of a hydrosilylation inhibitor to 100 total parts by mass of the components (A) to (C).

The composition preferably also comprises (F) 0.01 to 10 parts by mass of an adhesion promoter to 100 total parts by mass of the components (A) to (C).

The composition may comprise (G) an organopolysiloxane represented by the average formula:

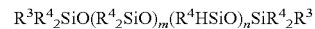
$R^3R^4{}_2SiO(R^4{}_2SiO)_m(R^4HSiO)_nSiR^4{}_2R^3$ (where $R^3$ is the same or different hydrogen or a monovalent hydrocarbon not having an aliphatic unsaturated carbon bond, $R^4$ is the same or different monovalent hydrocarbon not having an aliphatic unsaturated carbon bond, m is a number of 0 to 50, and n is a number of 0 to 50, but if n is 0, $R^3$ is hydrogen)
at a quantity so that the molar ratio of silicon-bonded hydrogen in the component (G) to alkenyl in the component (A) is at most 0.3.

Curing such a composition preferably forms a cured material having a durometer D hardness prescribed by JIS K 6253 of 30 to 70.

The composition is suitable as an adhesive of a semiconductor element.

The semiconductor device of the present invention is characterized in that a semiconductor element is adhered by a cured material of the curable organopolysiloxane composition.

Effects of the Invention

The curable organopolysiloxane composition of the present invention is characterized by having excellent adhesion to a semiconductor element, and forming a cured material with few bubbles. The semiconductor device of the present invention is characterized by having excellent reliability.

BRIEF DESCRIPTION OF THE DRAWING

FIG. 1 is a sectional view of a surface-mounted light-emitting diode (LED) device comprising an example of the semiconductor device of the present invention.

MODES FOR CARRYING OUT THE INVENTION

The component (A) is an organopolysiloxane having at least two alkenyls per molecule. Examples of the alkenyl in the component (A) are a C2-12 alkenyl such as vinyl, allyl, butenyl, pentenyl, hexenyl, heptenyl, octenyl, nonenyl, decenyl, undecenyl, or dodecenyl, and vinyl is preferred. Examples of a group bonding to silicon other than alkenyl in the component (A) are a C2-12 alkyl such as methyl, ethyl, propyl, isopropyl, butyl, isobutyl, tert-butyl, pentyl, neopentyl, hexyl, cyclohexyl, heptyl, octyl, nonyl, decyl, undecyl, or dodecyl; a C6-20 aryl such as phenyl, tolyl, xylyl, or naphthyl; a C7-20 aralkyl such as benzyl, phenetyl, or phenylpropyl; and groups in which some or all of the hydrogen in these groups is substituted by a halogen such as fluorine, chlorine, or iodine. The silicon in the component (A) may have a small quantity of hydroxyl or an alkoxy such as methoxy or ethoxy within a range that does not hinder the objectives of the present invention.

Although not specifically limited, examples of the molecular structure of the component (A) are a linear, partially branched linear, cyclic, or three-dimensional network structure. The component (A) may be one organopolysiloxane having these molecular structures, or a mixture of two or more organopolysiloxanes having these molecular structures.

A linear, partially branched linear, or cyclic organopolysiloxane is represented by the average unit formula:

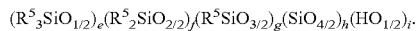
$(R^5_3SiO_{1/2})_e(R^5_2SiO_{2/2})_f(R^5SiO_{3/2})_g(SiO_{4/2})_h(HO_{1/2})_i$.

In this formula, $R^5$ is the same or different monovalent hydrocarbon, specific examples of which are a C1-12 alkyl such as methyl, ethyl, propyl, isopropyl, butyl, isobutyl, tert-butyl, pentyl, neopentyl, hexyl, cyclohexyl, heptyl, octyl, nonyl, decyl, undecyl, or dodecyl; a C2-12 alkenyl such as vinyl, allyl, butenyl, pentenyl, hexenyl, heptenyl, octenyl, nonenyl, decenyl, undecenyl, or dodecenyl; a C6-20 aryl such as phenyl, tolyl, xylyl, or naphthyl; a C7-20 aralkyl such as benzyl, phenetyl, or phenylpropyl; and groups in which some or all of the hydrogen in these groups is substituted by a halogen such as fluorine, chlorine, or iodine. At least two $R^5$ per molecule are alkenyl, preferably vinyl.

In the formula, e, f, g, h, and i are numbers indicating the ratio of the siloxane structural unit and the ratio of hydroxyl, and satisfy $0 \leq e \leq 0.05$, $0.9 \leq f \leq 1$, $0 \leq g \leq 0.03$, $0 \leq h \leq 0.03$, $0 \leq i \leq 0.2$, and $e+f+g+h=1$. This is because if e is greater than the upper limit of the range, the viscosity of the organopolysiloxane is reduced too much, which reduces the handling workability of the resulting composition and the hardness of the cured material. If g and h are greater than the upper limits of the ranges, the viscosity of the organopolysiloxane is increased too much, which reduces the handling workability of the resulting composition and makes the resulting cured material brittle. The range of f is determined by e, g, and h, but if f is less than the lower limit of the range, the resulting composition cannot be given a suitable viscosity and the cured material cannot be given a suitable hardness and mechanical strength. The organopolysiloxane is preferably a liquid at 25° C.; specifically, the viscosity at 25° C. is preferably a range of 3 to 100,000 mPa·s or more preferably a range of 5 to 5,000 mPa·s. This is because if viscosity is not less than the lower limit of the range, the resulting cured material has improved mechanical strength, and if viscosity is not greater than the upper limit of the range, the resulting composition has improved handling workability.

Examples of such an organopolysiloxane are organopolysiloxanes represented by the following average unit formulae. In the formulae, Vi indicates vinyl, Me indicates methyl, and Ph indicates phenyl.

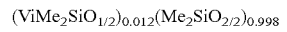
$(ViMe_2SiO_{1/2})_{0.012}(Me_2SiO_{2/2})_{0.998}$

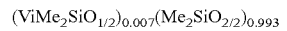
$(ViMe_2SiO_{1/2})_{0.007}(Me_2SiO_{2/2})_{0.993}$

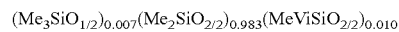
$(Me_3SiO_{1/2})_{0.007}(Me_2SiO_{2/2})_{0.983}(MeViSiO_{2/2})_{0.010}$

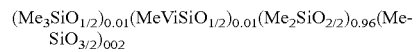
$(Me_3SiO_{1/2})_{0.01}(MeViSiO_{1/2})_{0.01}(Me_2SiO_{2/2})_{0.96}(MeSiO_{3/2})_{002}$

$(ViMe_2SiO_{1/2})_{0.005}(Me_2SiO_{2/2})_{0.895}(MePhSiO_{2/2})_{0.100}$ Other examples are the organopolysiloxanes represented by the following average formulae. In the formulae, Vi and Me are the same as given above.

$(MeViSiO_{2/2})_3$

$(MeViSiO_{2/2})_4$

$(MeViSiO_{2/2})_5$

A branched or three-dimensional network organopolysiloxane is represented by the average unit formula:

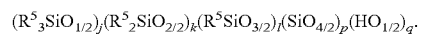
$(R^5_3SiO_{1/2})_j(R^5_2SiO_{2/2})_k(R^5SiO_{3/2})_l(SiO_{4/2})_p(HO_{1/2})_q$.

In the formula, $R^5$ is a monovalent hydrocarbon, examples of which are the same as given earlier. At least two $R^5$ per molecule are alkenyl, preferably vinyl.

In the formula, j, k, l, p, and q are numbers indicating the ratio of the siloxane structural unit and the ratio of hydroxyl, and satisfy $0.4 \leq j \leq 0.6$, $0 \leq k \leq 0.05$, $0 \leq l \leq 0.05$, $0.4 \leq p \leq 0.6$, $0 \leq q \leq 0.05$, and $j+k+l+p=1$. This is because if j is less than the lower limit of the range, the cured material has reduced mechanical strength, and if j is greater than the upper limit of the range, the cured material cannot be given sufficient hardness. If k is greater than the upper limit of the range, the cured material cannot be given sufficient hardness. If l is greater than the upper limit of the range, the cured material has reduced mechanical strength. If p is less than the lower limit of the range, the cured material cannot be given sufficient hardness, and if p is greater than the upper limit of the range, the resulting composition has reduced dispersion and the cured material cannot be given sufficient mechanical strength. The shape at 25° C. is not specifically limited and may be a liquid or a solid provided that it is compatible with the linear, partially branched linear, or cyclic organopolysiloxane.

Examples of such an organopolysiloxane are the organopolysiloxanes represented by the following average composition formulae. In the formulae, Vi, Me, and Ph are the same as given earlier.

$(ViMe_2SiO_{1/2})_{0.10}(Me_3SiO_{1/2})_{0.33}(SiO_{4/2})_{0.57}(HO_{1/2})_{0.03}$ $(ViMe_2SiO_{1/2})_{0.13}(Me_3SiO_{1/2})_{0.35}(SiO_{4/2})_{0.52}(HO_{1/2})_{0.02}$ $(ViMePhSiO_{1/2})_{0.10}(Me_3SiO_{1/2})_{0.45}(SiO_{4/2})_{0.45}(HO_{1/2})_{0.03}$ $(ViMe_2SiO_{1/2})_{0.09}(Me_3SiO_{1/2})_{0.31}(SiO_{4/2})_{0.60}(HO_{1/2})_{0.04}$ $(ViMe_2SiO_{1/2})_{0.10}(Me_3SiO_{1/2})_{0.40}(SiO_{4/2})_{0.50}(HO_{1/2})_{0.03}$

The component (A) preferably comprises 15 to 100 mass % of the linear, partially branched linear, or cyclic organopolysiloxane and 0 to 85 mass % of the branched or three-dimensional network organopolysiloxane. This is because if the content of the former organopolysiloxane is not less than the lower limit of the range, the resulting cured material can be given sufficient flexibility.

Because it has good handling workability, such a component (A) is preferably a liquid at 25° C.; specifically, viscosity at 25° C. is preferably a range of 100 to 5,000,000 mPa·s or more preferably a range of 500 to 100,000 mPa·s.

The component (B) is an organopolysiloxane resin represented by the average unit formula:

$(R^1_3SiO_{1/2})_a(R^1_2SiO_{2/2})_b(R^2SiO_{3/2})_c(SiO_{4/2})_d.$

In the formula, $R^1$ is the same or different hydrogen or monovalent hydrocarbon not having an aliphatic unsaturated carbon bond. Examples of the monovalent hydrocarbon of $R^1$ are a C1-12 alkyl such as methyl, ethyl, propyl, isopropyl, butyl, isobutyl, tert-butyl, pentyl, neopentyl, hexyl, cyclohexyl, heptyl, octyl, nonyl, decyl, undecyl, or dodecyl; a C6-20 aryl such as phenyl, tolyl, xylyl, or naphthyl; a C7-20 aralkyl such as benzyl, phenetyl, or phenylpropyl; and groups in which some or all of the hydrogen in these groups is substituted by a halogen such as fluorine, chlorine, or iodine. At least two $R^1$ per molecule, however, are hydrogen.

In the formula, $R^2$ is a monovalent hydrocarbon not having an aliphatic unsaturated bond, examples of which are the same groups as $R^1$.

In the formula, a, b, and c are numbers satisfying $0<a<1$, $0<b<1$, $0\le c<0.2$, and $0<d<1$, but $0.6\le a/d\le 1.5$, $1.5\le b/d\le 3$, and $a+b+c+d=1$, and preferably numbers satisfying $0.7\le a/d\le 1.5$ and $1.5\le b/d\le 2.5$, numbers satisfying $0.7\le a/d\le 1.4$ and $1.6\le b/d\le 2.5$, or numbers satisfying $0.8\le a/d\le 1.4$ and $1.6\le b/d\le 2$. This is because if a/d is not less than the upper limit of the range, the viscosity of the resulting composition is not increased too much, and if a/d is not less than the lower limit of the range, the resulting cured material has good adhesion characteristics. If b/d is within the range, the resulting cured material has good adhesion characteristics.

The weight average molecular weight (Mw) of such a component (B) is preferably 6,000 or greater, more preferably 8,000 or greater, and even more preferably 10,000 or greater. This is because if the weight average molecular weight of the component (B) is not less than the lower limit, the resulting cured material has good adhesive strength and bubbling in the cured material is inhibited.

Examples of such a component (B) are an organopolysiloxane represented by the average unit formula:

$(Me_3SiO_{1/2})_{0.23}(MeHSiO_{2/2})_{0.51}(SiO_{4/2})_{0.26}$ an organopolysiloxane represented by the average unit formula:

$(Me_3SiO_{1/2})_{0.24}(MeHSiO_{2/2})_{0.49}(SiO_{4/2})_{0.27}$, and an organopolysiloxane represented by the average unit formula:

$(Me_3SiO_{1/2})_{0.24}(Me_2SiO_{2/2})_{0.10}(MeHSiO_{2/2})_{0.40}(SiO_{4/2})_{0.26}.$

The content of the component (B) is a quantity so that the molar ratio of silicon-bonded hydrogen in the component (B) is a range of 0.5 to 5 to 1 mol of alkenyl in the component (A), and preferably a range of 0.5 to 3 mol and more preferably a range of 0.5 to 2 mol for the resulting cured material to have good hardness, mechanical characteristics, and adhesion.

The component (C) is a hydrosilylation catalyst for promoting hydrosilylation of the composition. Examples of such a component (C) are a platinum group metal catalyst or a platinum group metal compound catalyst, preferably a platinum-based catalyst, a rhodium-based catalyst, or a palladium-based catalyst, and more preferably a platinum-based catalyst. Examples of a platinum-based catalyst are platinum fine powder, platinum black, platinic chloride, an alcohol-modified platinic chloride, a complex of platinic chloride and a diolefin, a platinum-olefin complex, a platinum-carbonyl complex such as platinum bis(acetoacetate) or platinum bis(acetylacetonate), a platinic chloride-alkenylsiloxane complex such as platinic chloride-divinyltetramethyldisiloxane complex or platinic chloride-tetravinyltetramethylcyclotetrasiloxane, a platinum-alkenylsiloxane such as platinum-divinyltetramethyldisiloxane complex or platinum-tetravinyltetramethylcyclotetrasiloxane, and a complex between platinic chloride and acetylene alcohol; and especially preferably a platinum-alkenylsiloxane complex for good hydrosilylation performance.

Examples of the alkenylsiloxane are 1,3-divinyl-1,1,3,3-tetramethyldisiloxane, 1,3,5,7-tetramethyl-1,3,5,7-tetravinylcyclotetrasiloxane, alkenylsiloxane oligomers in which some of the methyl in the alkenylsiloxane is substituted with ethyl, phenyl, or the like, and alkenylsiloxane oligomers in which some of the vinyl in the alkenylsiloxane is substituted with allyl, hexenyl, or the like. In particular, 1,3-divinyl-1,1,3,3-tetramethyldisiloxane is preferred for good stability of the platinum-alkenylsiloxane produced.

To improve the stability of the platinum-alkenylsiloxane catalyst, these platinum-alkenylsiloxane catalysts are preferably dissolved in an alkenylsiloxane oligomer such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldi siloxane, 1,3-divinyl-1,1,3,3-tetraphenyldiloxane, or 1,3,5,7-tetramethyl-1,3,5,7-tetravinylcyclotetrasiloxane or an organosiloxane oligomer such as dimethylsiloxane oligomer, and especially preferably dissolved in an alkenylsiloxane oligomer.

The content of the component (C) is not limited provided that it is a quantity that promotes curing of the composition, and specifically, is a quantity so that the platinum group metal, especially platinum, in the composition is a range of 0.01 to 500 ppm, preferably a range of 0.01 to 100 ppm, and more preferably a range of 0.1 to 50 ppm by mass unit. This is because if the content of the component (C) is not greater than the lower limit of the range, the resulting composition has good hardness, and if the content is not less than the upper limit of the range, the resulting cured material resists problems such as colouring.

The composition preferably also comprises (D) a fumed silica having a BET specific surface area of 20 to 200 m²/g for the purpose of improving handling workability and adhesion. Although not limited, the content of the component (D) is preferably a range of 1 to 20 parts by mass to 100 total parts by mass of the components (A) to (C) to give the resulting cured material good mechanical characteristics.

The composition preferably contains (E) a hydrosilylation inhibitor to prolong the usable time at room temperature and improve storage stability. Examples of the component (E) are an alkyne alcohol such as 1-ethinylcyclohexan-1-ol, 2-methyl-3-butyn-2-ol, 3,5-dimethyl-1-hexyn-3-ol, or 2-phenyl-3-butyn-2-ol; an enyne compound such as 3-methyl-3-penten-1-yne or 3,5-dimethyl-3-hexen-1-yne; a methyl alkenyl siloxane oligomer such as 1,3,5,7-tetramethyl-1,3,5,7-tetrahexenylcyclotetrasiloxane; an alkyne oxysilane such as dimethylbis(3-methyl-1-butyn-3-oxy) silane or methylvinylbis(3-methyl-1-butyn-3-oxy)silane; an alkyne oxysilane compound such as methyltris(1-methyl-1-phenyl-propinoxy)silane, dimethylbis(1-methyl-1-phenyl-propinoxy)silane, methyltris(1,1-dimethyl-propinoxy)silane, or dimethylbis(1,1-dimethyl-propinoxy (silane); and benzotriazole.

The content of the component (E) is not limited, and is a sufficient quantity to inhibit curing and not cause gelling when the components (A), (B), and (C) are mixed, and preferably a range of 0.0001 to 5 parts by mass, more preferably a range of 0.01 to 5 parts by mass, and even more preferably a range of 0.01 to 3 parts by mass to 100 total parts by mass of components (A) to (C) to give the composition a sufficient pot life.

The composition preferably contains (F) an adhesion promoter to further improve adhesion to a substrate contacted while curing. The adhesion promoter may be a conventional adhesion promoter that can be added to a curable organopolysiloxane composition cured by hydrosilylation.

Examples of such a component (F) are an organosilane or a linear, branched, or cyclic organosiloxane oligomer of about 4 to 20 silicons, having a trialkoxysiloxy (for example, trimethoxysiloxy or triethoxysiloxy) or trialkoxysilylalkyl (for example, trimethoxysilylethyl or triethoxysilylethyl) and a hydroxyl or alkenyl (for example, vinyl or allyl); an organosilane or a linear, branched, or cyclic organosiloxane oligomer of about 4 to 20 silicons, having a trialkoxysiloxy or trialkoxysilylalkyl and a methacryloxyalkyl (for example, 3-methacryloxypropyl); an organosilane or a linear, branched, or cyclic organosiloxane oligomer of about 4 to 20 silicons, having a trialkoxysiloxy or trialkoxysilylalkyl and an epoxy-bonded alkyl (for example, 3-glycidoxypropyl, 4-glycidoxybutyl, 2-(3,4-epoxycyclohexyl)ethyl, or 3-(3,4-epoxycyclohexyl)propyl); an aminoalkyltrialkoxysilane and epoxy-bonded alkyltrialkoxysilane reaction product; and an epoxy-containing ethyl polysilicate; and specifically, vinyltrimethoxysilane, allyltrimethoxysilane, allyltriethoxysilane, hydrogentriethoxysilane, 3-glycidoxypropyltrimethoxysilane, 3-glycidoxypropyltriethoxysilane, 2-(3,4-epoxycyclohexyl)ethyltrimethoxysilane, 3-methacryloxyproyltrimethoxysilane, 3-methacryloxypropyltriethoxysilane), 3-glycidoxypropyltriethoxysilane and 3-aminopropyltriethoxysilane reaction product, silanol-blocked methylvinylsiloxane oligomer and 3-glycidoxypropyltrimethoxysilane condensation reaction product, silanol-blocked methylvinylsiloxane oligomer and 3-methacryloxypropyltriethoxysilane condensation reaction product, and tris(3-trimethoxysilyl-propyl)isocyanurate.

The content of the component (F) is not limited, and is preferably a range of 0.01 to 10 parts by mass or more preferably a range of 0.01 to 5 parts by mass to 100 total parts by mass of the components (A) to (C) for curing characteristics and not promoting discolouring of the cured material.

The composition may contain an organopolysiloxane having silicon-bonded hydrogen besides the component (B). An example of such an organopolysiloxane is (G) an organopolysiloxane represented by the following average formula:

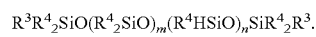
$R^3R^4{}_2SiO(R^4{}_2SiO)_m(R^4HSiO)_nSiR^4{}_2R^3$.

In the formula, $R^3$ is the same or different hydrogen or monovalent hydrocarbon not having an aliphatic unsaturated carbon bond. Examples of the monovalent hydrocarbon of $R^3$ are the same monovalent hydrocarbons as $R^1$.

In the formula, $R^4$ is the same or different monovalent hydrocarbon not having an aliphatic unsaturated carbon bond, examples of which are the same monovalent hydrocarbons as $R^1$.

In the formula, m is a number of 0 to 50 and n is a number of 0 to 50, but if n is 0, $R^3$ is hydrogen.

Examples of such an organopolysiloxane are organopolysiloxanes having the following average structural formulae. Me and Ph in the formulae are the same as given earlier.

$Me_3SiO(MeHSiO)_{10}SiMe_3$

$HMe_2SiO(Me_2SiO)_{10}SiMe_2H$

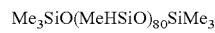
$Me_3SiO(MeHSiO)_{80}SiMe_3$

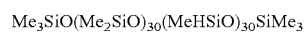
$Me_3SiO(Me_2SiO)_{30}(MeHSiO)_{30}SiMe_3$

$Me_2PhSiO(MeHSiO)_{35}SiMe_2Ph$

Although not limited, the content of such an organopolysiloxane is preferably a quantity so that the silicon-bonded hydrogen in the component (G) is 0.5 mol at most and more preferably 0.3 mol at most to 1 mol of total alkenyl in the component (A), so as to be able to obtain a cured material that has good adhesion and resists bubbling.

Provided that they do not hinder the objectives of the present invention, the composition may contain other arbitrary components, including an inorganic filler other than the component (D), such as silica, glass, alumina, or zinc oxide; silicone rubber powder; a resin powder such as silicone resin or polymethacrylate resin; a heat resistance agent, a dye, a pigment, a flame retardant, and a solvent.

The composition is preferably a liquid at 25° C. from the standpoint of handling workability, and the viscosity at 25° C. is preferably a range of 10 to 1,000,000 mPa·s. In the case that the composition is used as an adhesive of a semiconductor element, the viscosity at 25° C. is preferably a range of 1,000 to 500,000 mPa·s.

The composition is cured by allowing to sit at room temperature or heating, but preferably is heated to cure rapidly. The heating temperature is preferably a range of 50° C. to 200° C.

Such a composition has excellent initial adhesion and adhesion durability, especially when subjected to a hot-cold cycle, to a metal such as steel, stainless steel, aluminum, copper, silver, titanium, or a titanium alloy; a semiconductor element such as a silicon semiconductor, a gallium-phosphorus-based semiconductor, or a gallium-arsenic-based semiconductor; a ceramic; a glass, a thermoplastic resin; a thermoplastic resin having a polar group; or the like.

Curing the composition preferably forms a cured material having a durometer D hardness prescribed by JIS K 6253 of 30° C. to 70° C. This is because if the hardness is less than the lower limit of the range, the composition has poor cohesive force and does not obtain sufficient strength and adhesion, and if the hardness is greater than the upper limit of the range, the composition does not obtain sufficient adhesion.

Next, the semiconductor device of the present invention will be described in detail. The semiconductor device of the present invention is characterized in that a semiconductor element in a case is adhered by an adhesive cured material comprising the curable organopolysiloxane composition. The semiconductor element is specifically, for example, a light-emitting diode (LED), a semiconductor laser, a photodiode, a phototransistor, a solid-state image sensor, or a photocoupler and receptor, and especially preferably a light-emitting diode (LED).

Because light is emitted by a light-emitting diode (LED) from above, below, the left, and the right of a semiconductor, the parts constituting the device should not absorb light, for which materials are selected that have high light transmittance or high reflectivity. The substrate on which the semiconductor element is mounted is no exception to this. Examples of the substrate are a conductive metal such as silver, gold, or copper; a non-conductive metal such as aluminum or nickel; a thermoplastic resin mixed with a white pigment, such as PPA or LCP; a thermosetting resin containing a white pigment, such as epoxy resin, BT resin, polyimide resin, or silicone resin; and a ceramic such as alumina or alumina nitride. The composition has good adhesion to an optical semiconductor element and a substrate, and thus can improve the reliability of the resulting optical semiconductor device.

The semiconductor device of the present invention will be described in detail with reference to FIG. 1. FIG. 1 is a sectional view of a single surface-mounted light-emitting diode (LED) device which is a typical example of a semiconductor device. The light-emitting diode (LED) device in FIG. 1 has a light-emitting diode (LED) chip 5 adhered by an adhesive material 4 onto a die pad 3 in a case 1 made of polyphthalamide (PPA) resin, where the light-emitting diode (LED) chip 5 is bonded to an inner lead 2 by a bonding wire 6, and sealed together with the inner walls of the case by a sealing material 7. The curable organopolysiloxane composition of the present invention is used as the composition forming the adhesive material 4 in the semiconductor device of the present invention.

EXAMPLES

The curable organopolysiloxane composition and the semiconductor device of the present invention will be described in detail by examples and comparative examples. In the examples and comparative examples, viscosity is viscosity at 25° C., and the following components were used to prepare the curable organopolysiloxane compositions in the examples and comparative examples. In the formulae, Vi indicates vinyl and Me indicates methyl. In the formulae, the ratio SiH/Vi indicates the total number of moles of silicon-bonded hydrogen in the components (b-1) to (b-6) to 1 mol total of vinyl in the components (a-1) to (a-7).

Component (a-1): Organopolysiloxane having 60 mPa·s viscosity, represented by the average unit formula:

$(Me_2ViSiO_{1/2})_{0.042}(Me_2SiO_{2/2})_{0.958}$ (vinyl content=1.53 mass %)

Component (a-2): Organopolysiloxane having 550 mPa·s viscosity, represented by the average unit formula:

$(Me_2ViSiO_{1/2})_{0.012}(Me_2SiO_{2/2})_{0.988}$ (vinyl content=0.45 mass %)

Component (a-3): Cyclic methylvinylpolysiloxane having 4 mPa·s viscosity, represented by the average formula:

$(MeViSiO)_4$ (vinyl content=30 mass %)

Component (a-4): Cyclic methylvinylpolysiloxane having 30 mPa·s viscosity, represented by the average formula:

$HO(MeViSiO)_{20}H$ (vinyl content=30 mass %)

Component (a-5): Organopolysiloxane, solid at room temperature, represented by the average unit formula:

$(Me_2ViSiO_{1/2})_{0.55}(Me_3SiO_{1/2})_{0.05}(SiO_{4/2})_{0.40}$ (vinyl content=19.0 mass %)

Component (a-6): Organopolysiloxane, solid at room temperature, represented by the average unit formula:

$(Me_2ViSiO_{1/2})_{0.09}(Me_3SiO_{1/2})_{0.43}(SiO_{4/2})_{0.48}$
$(HO_{1/2})_{0.03}$ (vinyl content=3.0 mass %)

Component (a-7): Organopolysiloxane, solid at room temperature, represented by the average unit formula:

$(Me_2ViSiO_{1/2})_{0.10}(Me_3SiO_{1/2})_{0.45}(SiO_{4/2})_{0.45}$
$(HO_{1/2})_{0.02}$ (vinyl content=3.0 mass %)

Component (b-1): Organopolysiloxane having a viscosity of 2000 mPa·s, represented by the average unit formula:

$(Me_3SiO_{1/2})_{0.23}(MeHSiO_{2/2})_{0.51}(SiO_{4/2})_{0.26}$ (weight average molecular weight=18,000, silicon-bonded hydrogen content=0.78 mass %)

Component (b-2): Organopolysiloxane having a viscosity of 510 mPa·s, represented by the average unit formula:

$(Me_3SiO_{1/2})_{0.24}(MeHSiO_{2/2})_{0.49}(SiO_{4/2})_{0.27}$ (weight average molecular weight=16,300, silicon-bonded hydrogen content=0.75 mass %)

Component (b-3): Organopolysiloxane having a viscosity of 640 mPa·s, represented by the average unit formula:

$(Me_3SiO_{1/2})_{0.24}(Me_2SiO_{2/2})_{0.10}(MeHSiO_{2/2})_{0.40}$
$(SiO_{4/2})_{0.26}$ (weight average molecular weight=15,400, silicon-bonded hydrogen content=0.78 mass %)

Component (b-4): Organopolysiloxane having a viscosity of 230 mPa·s, represented by the average unit formula:

$(HMe_2SiO_{1/2})_{0.51}(Me_2SiO_{2/2})_{0.15}(SiO_{4/2})_{0.34}$
$(HO_{1/2})_{0.03}$ (weight average molecular weight=2,100, silicon-bonded hydrogen content=0.80 mass %)

Component (b-5): Organopolysiloxane having a viscosity of 120 mPa·s, represented by the average unit formula:

$(HMe_2SiO_{1/2})_{0.67}(SiO_{4/2})_{0.33}$ (weight average molecular weight=1,310, silicon-bonded hydrogen content=0.95 mass %)

Component (b-6): Organopolysiloxane having a viscosity of 10 mPa·s, represented by the average unit formula:

$Me_3SiO(MeHSiO)_{10}SiMe_3$ (weight average molecular weight=8,800, silicon-bonded hydrogen content=1.6 mass %)

Component (c): 1,3-Divinyl-1,1,3,3-tetramethyldisiloxane solution of platinum 1,3-divinyl-1,1,3,3-tetramethyldisiloxane complex, having a platinum metal content of about 4 wt %.

Component (d): Fumed silica (trade name RX200, made by Nippon Aerosil) having a BET specific surface area of 115 to 165 m²/g and a surface hydrophobised by hexamethyldisilazone.

Component (e): 1-Ethinylcyclohexan-1-ol

Component (f): Condensation reaction product of 3-glycidoxypropyltrimethoxysilane and methylvinylsiloxane oligomer with both chain ends sealed by silanol, having a viscosity of 30 mPa-s at 25° C.

The cured materials obtained by curing the curable organopolysiloxane compositions in the examples and comparative examples were measured as follows for hardness, die shear strength, and the number of bubbles in the cured material.

Hardness of Cured Material

A sheet cured material was fabricated by press-moulding the curable organopolysiloxane composition for one hour at 150° C. The hardness of this sheet cured material was measured using a type D durometer prescribed by JIS K 6253.

Die Shear Strength

The curable organopolysiloxane composition was coated by a dispenser over five areas, at about 300 mg per area, on a silver-plated steel plate measuring 25 mm×75 mm Next, the composition was heated to 150° C. for two hours to cure while covered with a 1-mm thick and 10-mm square glass chip and clamped by a 1-kg plate. Subsequently, the material was cooled to room temperature, and measured for die shear strength using a Bond Tester SS-100KP made by Seishin Trading Co., Ltd.

Number of Bubbles in Cured Material

The number of bubbles in the die shear strength test piece fabricated by the method above was counted visually.

Examples 1-6 and Comparative Examples 1-3

Curable organopolysiloxane compositions were prepared using the mixture ratios shown in Table 1. The characteristics of the cured materials were measured as described earlier, with the results shown in Table 1.

Table 1
[row 1]
1: Category
2: The present invention
3: Comparative examples
[row 2]
4: Item
5: Example 1 [amend number as appropriate]
. . .
6: Comparative Example 1 [amend number as appropriate]
. . .
[column 1]
7: Curable organopolysiloxane composition (parts by mass)
8: SiH/Vi ratio
9: Cured material
[column 2]
10: Component (a-1) [amend as appropriate]
. . .
11: Durometer D hardness
12: Die shear strength (MPa)
13: Number of bubbles in cured material

INDUSTRIAL APPLICABILITY

The curable organopolysiloxane composition of the present invention is useful as an adhesive of a semiconductor element such as a light-emitting diode (LED), a phototransistor, a solid-state image sensor, or a photocoupler emitter and receptor. The semiconductor device of the present invention is useful as a semiconductor device such as an optical device, an optical instrument, lighting equipment, or a lighting system.

DESCRIPTION OF THE REFERENCE NUMERALS

1 Housing made of polyphthalamide (PPA) resin
2 Inner lead

TABLE 1

| | | Category | | | | | | | | |
|---|---|---|---|---|---|---|---|---|---|---|
| | | The Present Invention | | | | | | Comparative Examples | | |
| | Item | Ex. 1 | Ex. 2 | Ex. 3 | Ex. 4 | Ex. 5 | Ex. 6 | Comp. Ex. 1 | Comp. Ex. 2 | Comp. Ex. 3 |
| Curable | Component (a-1) | 20.8 | 20.8 | 22.5 | 20.8 | — | — | 21.6 | 22.5 | — |
| Organo- | Component (a-2) | — | — | — | — | 22.3 | 22.3 | — | — | 24.0 |
| poly- | Component (a-3) | 1.4 | 1.4 | — | 1.5 | — | — | 1.4 | 1.4 | — |
| siloxane | Component (a-4) | — | — | — | — | 2.4 | 1.0 | — | — | 2.4 |
| Compo- | Component (a-5) | 2.6 | 1.3 | — | 1.5 | — | 1.4 | 2.6 | 1.4 | — |
| sition | Component (a-6) | 48.5 | 48.5 | 52.5 | 48.5 | — | — | 50.3 | 52.5 | — |
| (parts | Component (a-7) | — | — | — | — | 52.0 | 52.0 | — | — | 56 |
| by | Component (b-1) | 14.7 | — | — | — | — | 13.0 | — | — | — |
| mass) | Component (b-2) | — | 14.5 | 13.0 | — | 14.0 | — | — | — | — |
| | Component (b-3) | — | — | — | 16.0 | — | — | — | — | — |
| | Component (b-4) | — | — | — | — | — | — | 8.1 | — | — |
| | Component (b-5) | — | — | — | — | — | — | — | 6.8 | — |
| | Component (b-6) | — | 1.5 | — | 1.0 | — | 1.0 | 4.0 | 3.4 | — |
| | Component (c) | 0.025 | 0.025 | 0.025 | 0.025 | 0.025 | 0.025 | 0.025 | 0.025 | 0.025 |
| | Component (d) | 9.0 | 9.0 | 9.0 | 9.0 | 6.3 | 6.3 | 9.0 | 9.0 | 6.3 |
| | Component (e) | 0.03 | 0.03 | 0.03 | 0.03 | 0.03 | 0.03 | 0.03 | 0.03 | 0.03 |
| | Component (f) | 3.0 | 3.0 | 3.0 | 3.0 | 3.0 | 3.0 | 3.0 | 3.0 | 3.0 |
| | SiH/Vi ratio | 1.1 | 1.5 | 1.4 | 1.2 | 1.2 | 1.4 | 1.3 | 1.2 | 1.4 |
| Cured | Durometer D Hardness | 59 | 61 | 53 | 60 | 57 | 58 | 58 | 57 | 55 |
| Material | Die Shear Strength (MPa) | 7.4 | 7.1 | 6.3 | 6.7 | 7.2 | 7.3 | 5.9 | 5.1 | 4.4 |
| | Number of Bubbles in Cured Material | <5 | <5 | <5 | <5 | <5 | <5 | >10 | >10 | >10 |

3 Die pad
4 Adhesive material
5 Light-emitting diode (LED) chip
6 Bonding wire
7 Sealing material

The invention claimed is:

1. A curable organopolysiloxane composition comprising at least
    (A) an organopolysiloxane having at least 2 alkenyl groups per molecule;
    (B) an organopolysiloxane resin represented by the average unit formula:
    $(R^1{}_3SiO_{1/2})_a(R^1{}_2SiO_{2/2})_b(R^2SiO_{3/2})_c(SiO_{4/2})_d$
    where each $R^1$ is the same or different hydrogen atom or a monovalent hydrocarbon group not having an aliphatic unsaturated carbon bond, but at least two $R^1$ per molecule are hydrogen atoms, $R^2$ is a monovalent hydrocarbon group not having an aliphatic unsaturated bond, and a, b, and c are numbers satisfying $0<a<1$, $0<b<1$, $0\leq c<0.2$, and $0<d<1$, but $0.6\leq a/d\leq 1.5$, $1.5\leq b/d\leq 3$, and $a+b+c+d=1$
    and present at a quantity so that the molar ratio of silicon-bonded hydrogen in the component (B) to alkenyl groups in the component (A) is 0.5 to 5; and
    (C) a hydrosilylation catalyst present at a sufficient quantity to cure the composition.

2. The curable organopolysiloxane composition according to claim 1, also comprising (D) 1 to 20 parts by mass of fumed silica having a BET specific surface area of 20 to 200 m$^2$/g to 100 total parts by mass of the components (A) to (C).

3. The curable organopolysiloxane composition according to claim 1, also comprising (E) 0.001 to 5 parts by mass of a hydrosilylation inhibitor to 100 total parts by mass of the components (A) to (C).

4. The curable organopolysiloxane composition according to claim 1, also comprising (F) 0.01 to 10 parts by mass of an adhesion promoter to 100 total parts by mass of the components (A) to (C).

5. The curable organopolysiloxane composition according to claim 1, also comprising (G) an organopolysiloxane represented by the average formula:
$R^3R^4{}_2SiO(R^4{}_2SiO)_m(R^4HSiO)_nSiR^4{}_2R^3$
    where each $R^3$ is the same or different hydrogen atom or a monovalent hydrocarbon group not having an aliphatic unsaturated carbon bond, $R^4$ is the same or different monovalent hydrocarbon group not having an aliphatic unsaturated carbon bond, m is a number of 0 to 50, and n is a number of 0 to 50, but if n is 0, $R^3$ is hydrogen
    and present at a quantity so that the molar ratio of silicon-bonded hydrogen in the component (G) to alkenyl groups in the component (A) is at most 0.5.

6. The curable organopolysiloxane composition according to claim 1, wherein curing forms a cured material having a durometer D hardness prescribed by JIS K 6253 of 30 to 70.

7. The curable organopolysiloxane composition according to claim 1, comprising an adhesive of a semiconductor element.

8. A semiconductor device, characterized in that a semiconductor element is adhered by a cured material of the curable organopolysiloxane composition according to claim 1.

* * * * *